(12) United States Patent
Sweis

(10) Patent No.: US 8,438,506 B2
(45) Date of Patent: May 7, 2013

(54) METHOD AND SYSTEM FOR IMPLEMENTING CONTROLLED BREAKS BETWEEN FEATURES USING SUB-RESOLUTION ASSIST FEATURES

(75) Inventor: Jason Sweis, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/335,785

(22) Filed: Dec. 22, 2011

(65) Prior Publication Data

US 2012/0096414 A1    Apr. 19, 2012

Related U.S. Application Data

(62) Division of application No. 11/934,662, filed on Nov. 2, 2007, now Pat. No. 8,103,985.

(51) Int. Cl.
*G06F 17/50* (2006.01)
(52) U.S. Cl.
USPC ............................................. 716/53; 716/54
(58) Field of Classification Search .............. 716/53, 716/54
See application file for complete search history.

(56) References Cited

U.S. PATENT DOCUMENTS

| | | |
|---|---|---|
| 6,541,165 B1 | 4/2003 | Pierrat |
| 2005/0120326 A1 | 6/2005 | Semmler et al. |
| 2005/0287483 A1 | 12/2005 | Lercel et al. |
| 2007/0128525 A1* | 6/2007 | Wallace et al. ............... 430/5 |
| 2008/0301620 A1 | 12/2008 | Ye et al. |
| 2009/0138835 A1 | 5/2009 | Sinha et al. |

FOREIGN PATENT DOCUMENTS

EP    1439419    1/2004

OTHER PUBLICATIONS

Bailey, G. et al. "Double pattern EDA solutions for 32nm HP and beyond", Design for Manufacturability through Design-Process Integration, Proceedings of SPIE vol. 6521, 65211 K, (2007).
Chiou, T-B., "The Magnitude of Potential Exposure-Tool-Induced Critical Dimension and Overlay Errors in Double Dipole Lithography for the 65-nm and 45-nm Technology Nodes", Japanese Journal of Applied Physics, 2004 The Japan Society of Applied Physics, vol. 43, No. 6B, 2004, pp. 3672-3679.
Final Office Action dated Apr. 29, 2011 for U.S. Appl. No. 11/934,662.
Kahng, A.B. "Key Directions and a Roadmap for Electrical Design for Manufacturability", Proc. European Solid-Slate Circuits Conference 2007.
Kahng, A.B. "Opportunities in Future Physical Implementation and Manufacturing Handoff Flows" Proc. Inl'l SoC Design Conference, 2007.
Kahng, A.B. et al. "Subwavelength Optical Lithography: Challenges and Impact on Physical Design", ISPD '99 Monterey, CAUSA, pp. 112-119.
Non-Final Office Action dated Jun. 21, 2012 for U.S. Appl. No. 13/335,196.

(Continued)

*Primary Examiner* — Suresh Memula
(74) *Attorney, Agent, or Firm* — Vista IP Law Group, LLP

(57) ABSTRACT

Disclosed is a method, system, and computer program product for implementing controlled breaks using sub-resolution assist features. Sub-resolution bridging features are added to implement controlled breaks between features on the layout. The bridging features may also be used to facilitate or optimize multiple mask/exposure techniques that split a layout or features on a layout to address pitch problems.

20 Claims, 20 Drawing Sheets

OTHER PUBLICATIONS

Non-Final Office Action dated Nov. 10, 2010 for U.S. Appl. No. 11/934,662.
Notice of Allowance dated Sep. 20, 2011 for U.S. Appl. No. 11/934,662.
Torres, JA et al. "Contrast analysis and optimization for resolution enhancement technique", 2003 Society of Photo-Optical Instrumentation Engineers, Apr. 2003, val. 2, No. 2, pp. 119-128.

* cited by examiner

Print all features with same mask

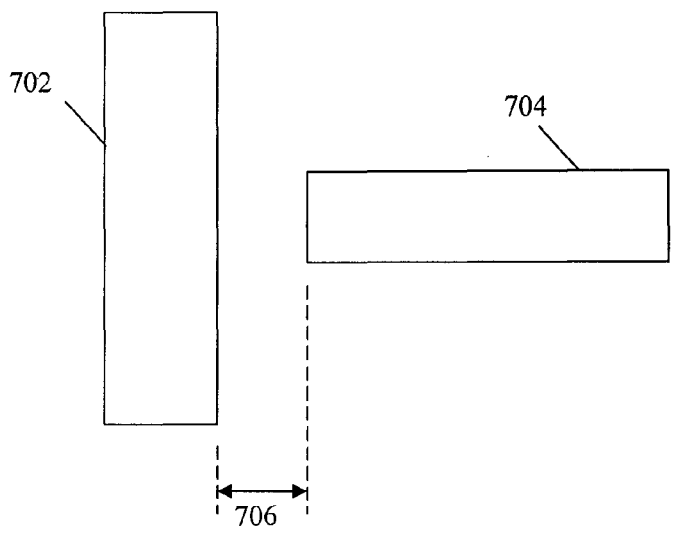
Fig. 10C
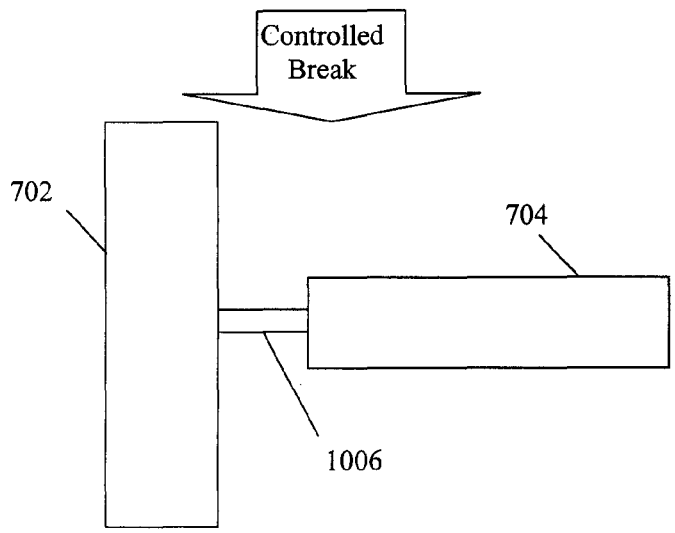
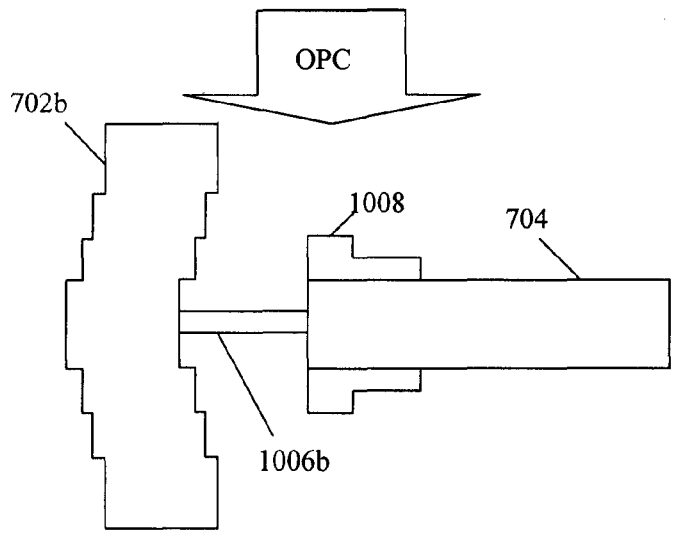
Print all features with same mask

Print all features with the same mask

METHOD AND SYSTEM FOR IMPLEMENTING CONTROLLED BREAKS BETWEEN FEATURES USING SUB-RESOLUTION ASSIST FEATURES

CROSS REFERENCE TO RELATED APPLICATION(S)

This Application is a divisional application of U.S. patent application Ser. No. 11/934,662, now U.S. Pat. No. 8,103,985, entitled "METHOD AND SYSTEM FOR IMPLEMENTING CONTROLLED BREAKS BETWEEN FEATURES USING SUB-RESOLUTION ASSIST FEATURES" and filed on Nov. 2, 2007. This Application is further cross-related to U.S. patent application Ser. No. 13/335,196, entitled "METHOD AND SYSTEM FOR IMPLEMENTING CONTROLLED BREAKS BETWEEN FEATURES USING SUB-RESOLUTION ASSIST FEATURES" and filed concurrently under with this Application. The content of both U.S. patent applications is hereby expressly incorporated by reference in its entirety for all purposes.

BACKGROUND AND SUMMARY

A semiconductor integrated circuit (IC) has a large number of electronic components, such as transistors, logic gates, diodes, wires, that are fabricated by forming layers of different materials and of different geometric shapes on various regions of a wafer. Many phases of physical design may be performed with computer aided design (CAD) tools or electronic design automation (EDA) systems. To design an integrated circuit, a designer first creates high level behavior descriptions of the IC device using a high-level hardware design language. The high level behavior descriptions of the IC device are translated into netlists of various levels of abstraction using a computer synthesis process. A netlist describes interconnections of nodes and components on the chip and includes information of circuit primitives such as transistors and diodes, their sizes and interconnections, for example.

An integrated circuit designer may use EDA layout tools to create a physical integrated circuit design layout from a logical circuit design. The layout tools use geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools.

Optical lithography, which is also referred to as photolithography, is a fabrication process by which patterns for various devices are generated on substrate wafers. One or more photomask, or more simply "masks," provide the master image of a layer of a given integrated circuit chip's physical geometries. A typical photolithography system projects UV light energy onto and through the one or more masks in order to transmit the mask pattern in reduced size to the wafer surface, where it interacts with a photosensitive coating on the wafer.

The resolution limit of conventional optical lithography technology is increasingly being challenged by the sub wavelength dimensions of the critical IC feature dimensions and geometries. Not only are the critical dimension feature geometries steadily decreasing in size, but the quantity of these features is also growing at a dramatic rate as well. These critical feature geometries also need to be patterned very precisely due to the severity and sensitivity of the imaging process. Extreme precision is required for sub wavelength, or low-kl, applications due to highly non-linear imaging behaviors which often magnify mask errors by large factors and in non-intuitive manners.

For at least these reasons, designers are increasingly aggressive in their use of artificial layout enhancement for manufacturability (LEM) features such as Resolution Enhancement Technology (RET) and Optical Proximity Correction (OPC). These are usually in the form of mask data manipulation which counter the effects of the modeled behavior of the entire lithography process.

To illustrate how OPC may be advantageously used to enhance the resolution of a manufactured layout, consider the example layout portion shown in FIG. 1. This layout portion includes a first feature 102 in an end-to-end configuration relative to a second feature 106. The two features 102 and 106 are separated by distance 112, where the distance 112 significantly exceeds critical dimension thresholds for the layout.

Due to well understood optical lithographic effects, it is highly unlikely that features 102 and 106 will end up lithographically printed as regular rectangular shapes having the exact position and exact shape (e.g., sharp corners) of the patterns shown in the original layout. In fact, it is quite likely that all of the sharp corners of the original layout patterns will be smoothed away leaving rounded corners and non-straight edges. It is also quite likely that the location and dimensions of the resultant printed shapes will shift a considerable distance from the original layout pattern locations.

A possible example of a printed shape for feature 102 is shown as shape 104a. A possible example of a printed shape for feature 106 is shown as shape 108a. It is noted that the location of the printed shapes in this example has varied from the original location of the layout features 102 and 106. For example, the extended end of printed shape 104a does not quite reach the original position of the edge of the feature 102, but instead varies by a distance 110 away from the original edge of feature 102. Moreover, the end of the shape 104a has an excessively rounded appearance that is significantly narrower than the width of the original feature 102. The dimensional and location-related variances between the actually printed shape 104a and the original rectangular layout feature 102 may result in performance or yield problems for the final IC product.

To address these problems, an EDA tool may apply OPC processing to modify the existing layout or add new features to the layout to provide enough bias such that the lithographically printed shapes will more closely match the desired shape, location, and dimensions of the desired layout features. For example, OPC processing may be used to add hammerhead patterns 114 and 116 to features 102 and 106, respectively. If the OPC structures 114 and 116 are properly configured, the printed shapes 104b and 108b will have their end edges substantially match the location of the end edges of the features 102 and 106. In addition, the width of the end portions of printed shapes 104b and 108b will substantially approach the width of the features 102 and 106.

In the example of FIG. 1, the designer was fortunate enough to have sufficient space between the two features 102 and 106 to add the required OPC structures. However, with many modern IC designs, it is quite likely that layout objects are placed with very little available space between features. There is usually a limit on how small or close the lines and spaces can be based on the process capability. In many cases, particularly for the common configuration having line end to line end, the limited space between the features will also limit how and how much RET is available and therefore limit the ability to address allowable line end shortening (LES).

To illustrate this problem, consider the example layout portion shown in FIG. 2. This layout portion includes a first feature 202 in an end-to-end configuration relative to a second feature 206. Here, the two features 202 and 206 are separated by a very small distance 212, where the distance 212 significantly corresponds to critical dimension thresholds for the layout.

Without OPC processing, the lithographically printed shapes 204a and 208a have dimensions, locations, and shapes that substantially vary from the intended dimensions, locations, and shapes of the original layout features 202 and 206. For example, the extended end of printed shape 204a does not quite reach the original position of the edge of the feature 202, where the printed shape 204a varies by a distance 210a away from the original edge of feature 202. In addition, the end of the printed shape 204a has an excessively sharpened and rounded appearance that is significantly narrower than the width of the original feature 202.

OPC may be applied to correct some of these printing issues. For example, OPC structures 214 and 216 may be added to the layout to bias the end-width of the printed shapes 204b and 208b such that the ends of the printed shapes 204b and 208b appear more rectangular and have a width that more closely approximates the width of the original features 202 and 206.

However, there is insufficient spacing between the features 202 and 206 to allow conventional OPC processing to significantly bias the ends of printed shapes 204b and 208b towards each other because of mask rule constraints. As such, even after conventional OPC processing is applied, the ends of printed shapes 204b and 208b suffer from significant line end shortening.

As is evident, there is a need for improved approaches to address and correct for the shortcomings of conventional RET and OPC processing.

Some embodiments of the present invention provide a method, system, and computer program product for implementing controlled breaks using sub-resolution assist features. Sub-resolution bridging features are added to implement controlled breaks between features on the layout. The bridging features may also be used to facilitate or optimize multiple mask/exposure techniques that split a layout or features on a layout to address pitch problems.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF DRAWINGS

FIGS. 10A-C, 11A-B, and 12A-C illustrate controlled breaks applied to an example layout portions to facilitate or optimize multi-mask/exposure printing according to some embodiments of the invention.

DETAILED DESCRIPTION

Some embodiments of the present invention provide a method, system, and computer program product for implementing controlled breaks using sub-resolution assist features (SRAF).

According to some embodiments, an SRAF is placed in the opening between two disconnected features. In essence, the SRAF "bridges" across two features such that the combination of the two features and the mask essentially forms a single interconnected feature on the mask. The SRAF is not printable, so that the final printed shapes will not be shorted across the intended opening between two features. However, the placement and dimension of the SRAF will cause a "controlled break" to occur for that intended opening between the two features such that the biasing resulting from the SRAF bridge will cause the two features to lithographically print in a manner that more closely matches the ideal shape, dimension, or location of the intended layout.

Using simulation of the process capability, one can determine the optimal location of the SRAF and its length. Previous technology nodes did not need to consider pushing sub-resolution wavelength limits because the wavelength of the scanner was improving with the process requirements. All previous nodes used mild forms of RET to achieve sub-resolution needs until the smaller wavelength stepper/scanner came around. The present invention allows the designer, for example, to push the limit on line end spacing by implementing bridging with placement of a SRAF at the break point.

Figure 1:
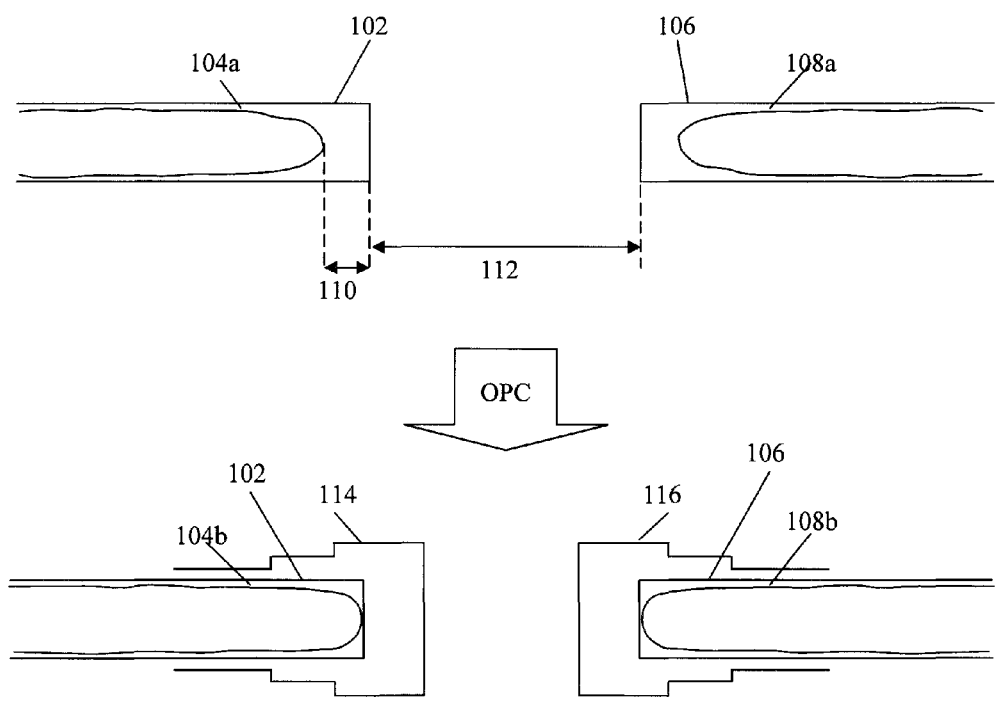
FIG. 1 illustrates OPC processing on example layout objects.
Figure 2:
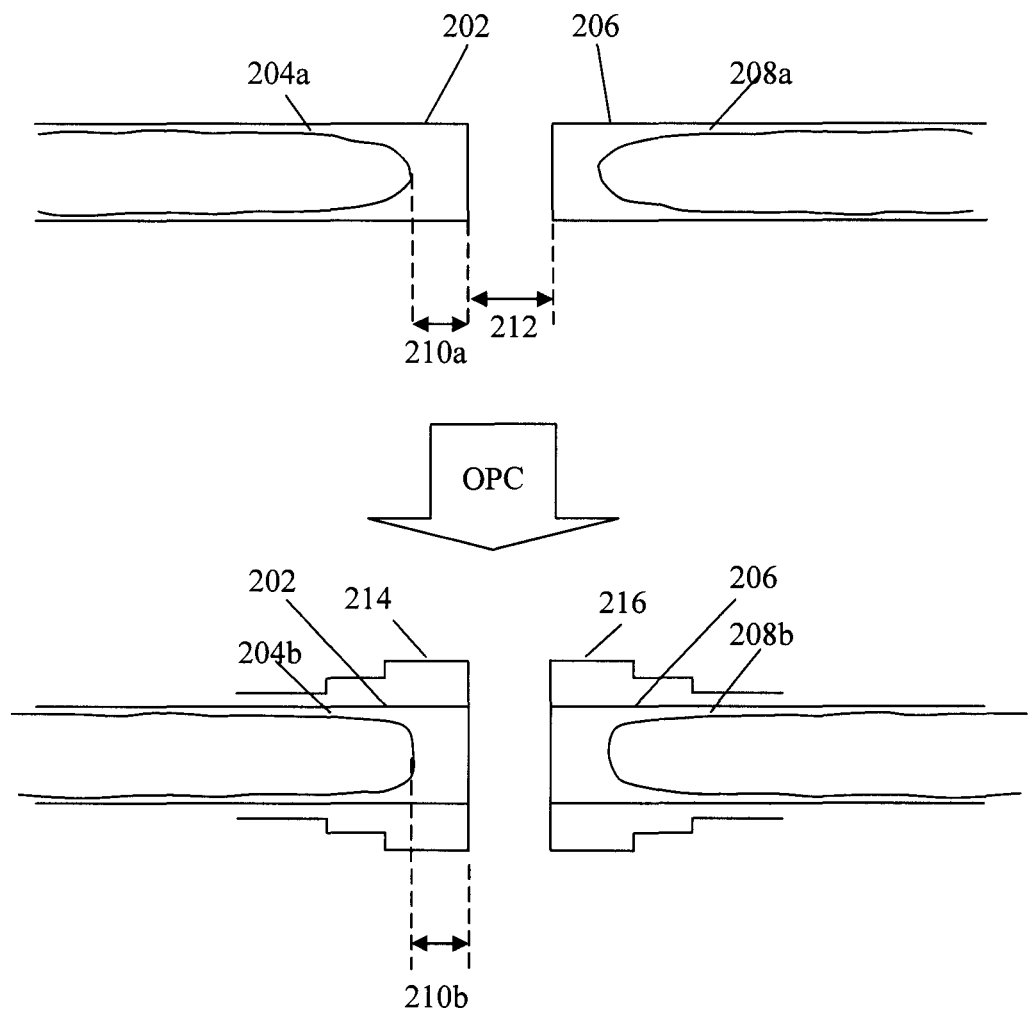
FIG. 2 illustrates some limitations of OPC processing techniques.
Figure 3:
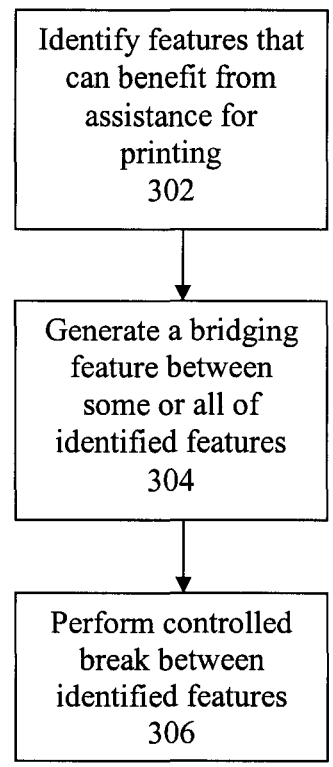
FIG. 3 shows a flowchart of a process for implementing controlled breaks according to some embodiments of the invention.

FIG. 3 shows a flowchart of a process for implementing the invention according to some embodiments. At 302, the process identifies features within the layout that can benefit from the present invention during the lithography process. For example, the present invention can be used to benefit locations on the mask at which it is needed to achieve a very fine separation gap between two features, such as between two line ends or between a line end and an edge. The line end to line end separation space is particularly challenging to implement, especially for memory designers where there is typically a "brick wall" type of design. Allowing further compression of the space between line ends, as permitted using the present invention, provides a significant competitive advantage.

At 304, a bridging feature is placed between some or all of the identified features. The configuration, shape, dimensions, size, distance, and location of the bridging feature is selected to optimize the features to be enhanced. In one embodiment, a rules-based operation is employed determine the configuration of the bridging feature. In an alternative embodiment, a library of bridging patterns may be generated and consulted when inserting the SRAF bridge. In yet another embodiment, heuristics may be employed to implement the configuration of the bridging feature.

One or more manufacturing/lithography models may be employed to implement the bridging feature. The models may be used in the initial determination of the parameters for the feature. The models may also be consulted to simulate and predict the effects of the inserted bridging feature. The models may also be employed to modify or correct the configuration settings for the bridging feature.

In some embodiment, the bridging feature(s) are generally inserted into the layout during layout optimization. The final layout is used to create masks that include the SRAF bridging features.

During manufacturing (at 306 in the flowchart), the bridging features will lithographically cause "controlled breaks" to form between the layout features of interest. The "break" or opening will be formed since the bridge features are sub-resolution and will not be printed. Even though the bridges are not printable, they will create biasing that cause adjacent features to lithographically print in a manner that more closely matches the ideal shape, dimension, or location of the intended layout.

Figure 4A:
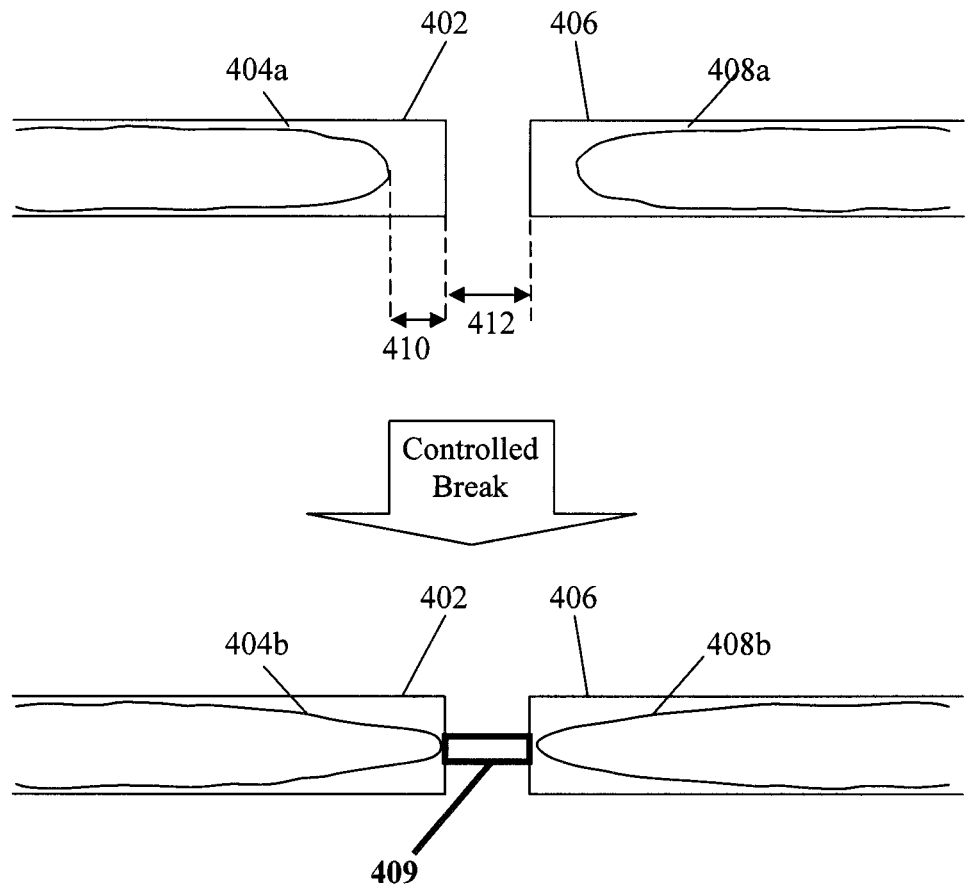
FIGS. 4A-B illustrate controlled breaks applied to an example layout portion according to some embodiments of the invention.

FIG. 4A provides an illustrative example of how the controlled break of the present invention can be used to address line end shortening. The illustrated layout portion includes a first feature 402 in an end-to-end configuration relative to a second feature 406. The two features 402 and 406 are separated by a very small distance 412, where the spacing distance 412 is too small to allow conventional OPC or RET techniques to correct line end spacing problems. As a result, it is likely that the extended end of lithographically printed shape 404*a* will not reach the originally intended position of the edge of the feature 402, where the printed shape 404*a* varies by a distance 410 away from the original edge of feature 402.

A controlled break can be used to correct the line end spacing problem associated with the printed shapes 404*a* and 404*b*. An SRAF bridge 409 is inserted between features 402 and 406. This essentially results in a single larger structure composed of feature 402, 409, and 406. For the mask manufacturer, this single large structure with the integrated bridging feature will now be seen as a long line, which has either 1 or 2 notches at the location of the bridging feature. The bridging feature 409 provides enough of a bias such that the end of lithographically printed shape 404*b* will now extend to approximately the intended end location of the original feature 402. The size, location, and dimensions of the bridging feature should be selected to ensure that it provides an adequate amount of biasing to the printed line ends. Too much biasing and the printed line ends may become too close to each other. Too little biasing and the line ends may be printed with an excessive gap between the two structures. Modeling may be employed to configure the proper configuration of the bridging feature and to predict the location and dimensions of the printed shapes.

Because the bridging feature is a SRAF structure, it will not itself be printed—a "break" or opening will still exist between the two printed shapes 404*b* and 408*b*. The size, location, and dimensions of the bridging feature should be selected to ensure that it remains a non-printable feature. Surrounding objects may need to be considered to ensure the proper configuration of the bridging feature. For example, the presence of adjacent/parallel scattering bars may unintentionally cause a normally non-printing SRAF structure to become printable. Therefore, these surrounding objects should be taken into account when determining how to configure the bridging feature such that it remains non-printable.

Figure 4B:
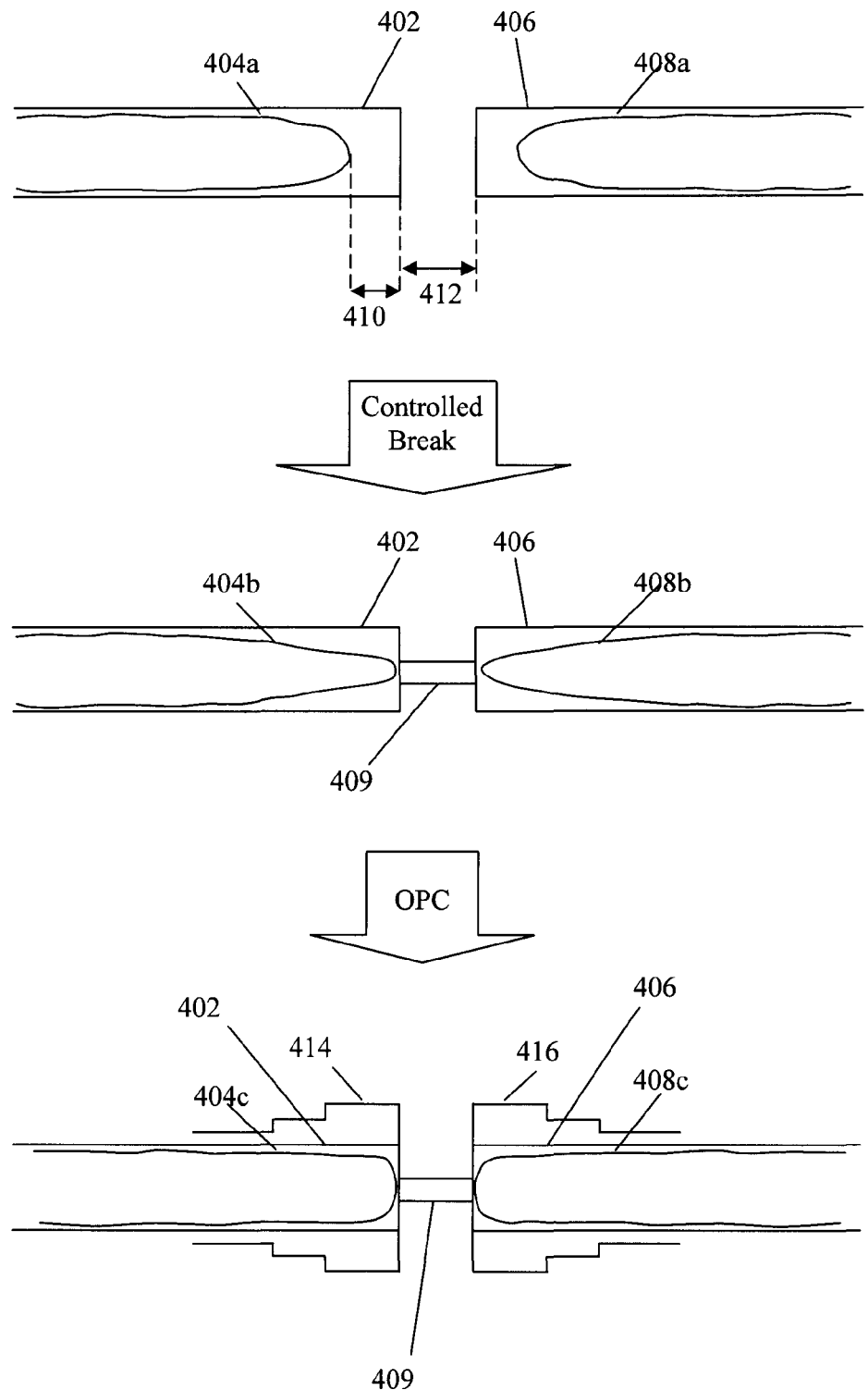

It can be seen that the end of the printed shape 404*a* still has an excessively sharpened and rounded appearance that is significantly narrower than the width of the original feature 402. As shown in FIG. 4B, the controlled break technique can be combined with RET or OPC techniques to optimally manufacture the layout objects. Here, OPC processing can be used to add hammerhead structures 414 and 416 along the ends of features 402 and 406, respectively. During the lithography process, the OPC structures 414 and 416 help cause the printed shapes 404*c* and 408*c* to be printed with end dimensions having widths and dimensions that will substantially approach the intended widths and shapes of the layout features 402 and 406.

Figure 5:
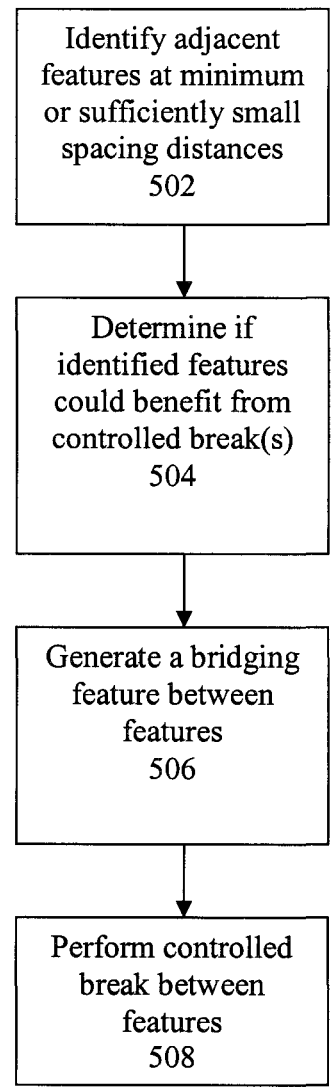
FIG. 5 shows a flowchart of a process for identifying and performing controlled break processing on features in a layout according to some embodiments of the invention.

FIG. 5 provides a flowchart of one approach for determining which features within a layout will be optimized using the controlled break approach of the present invention. In this embodiment, the process begins at 502 by identifying adjacent features that have small enough spacing between them such that it may be beneficial to include a bridging feature. For example, all adjacent features which are separated by minimum spacing rule distances are potential candidates to include a SRAF bridging feature.

At 504, a determination is made whether the layout for these candidate features should be modified to include bridging features. One approach that can be used to make this determination is to calculate whether and to what extent such bridging features can benefit the printing of those features. If the determination is that the controlled break is beneficial, then at 506 a bridging feature is inserted between such identified features. During the lithography process, at 508, the bridging features would cause a controlled break to be performed to optimally print the layout objects.

Figure 6A:
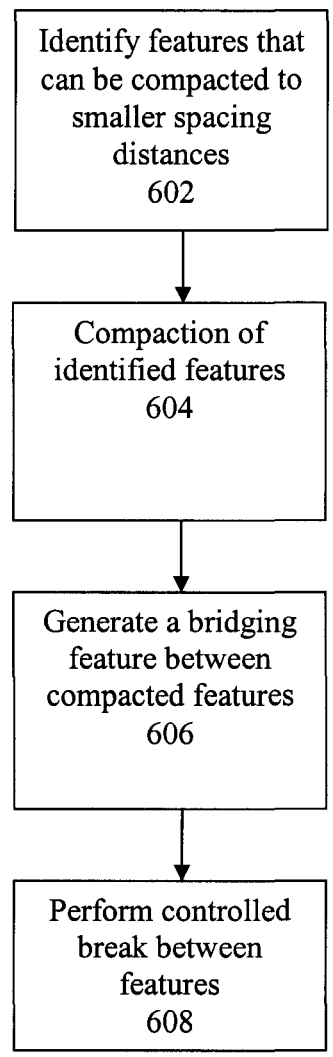
FIG. 6A shows a flowchart of a process for applying controlled break processing to implement compaction according to some embodiments of the invention.

The present invention can also be used to facilitate other types of layout optimizations. FIG. 6A shows a flowchart of an embodiment of a process for performing compaction using the controlled break approach of the invention. The process begins at 602 by identifying features that can be compacted together with smaller spacing distances. These features may exist on a layout with larger smaller distances for many reasons, e.g., because the larger spacing distances allow insertion of RET/OPC structures to correct line end spacing problems. With conventional technologies, compacting these features may cause printing problems such as printing of end-to-end lines with excessive spacing between line ends.

Here, such identified features can be more compacted within the layout (604). This is because controlled breaks can be implemented to ensure that end-to-end lines are properly printed with respect to the spacing of their line ends. At 606, bridging features are generated as appropriate for the compacted features. During the lithography process, at 608, the bridging features would cause a controlled break to be performed to optimally print the layout objects.

Figure 6B:
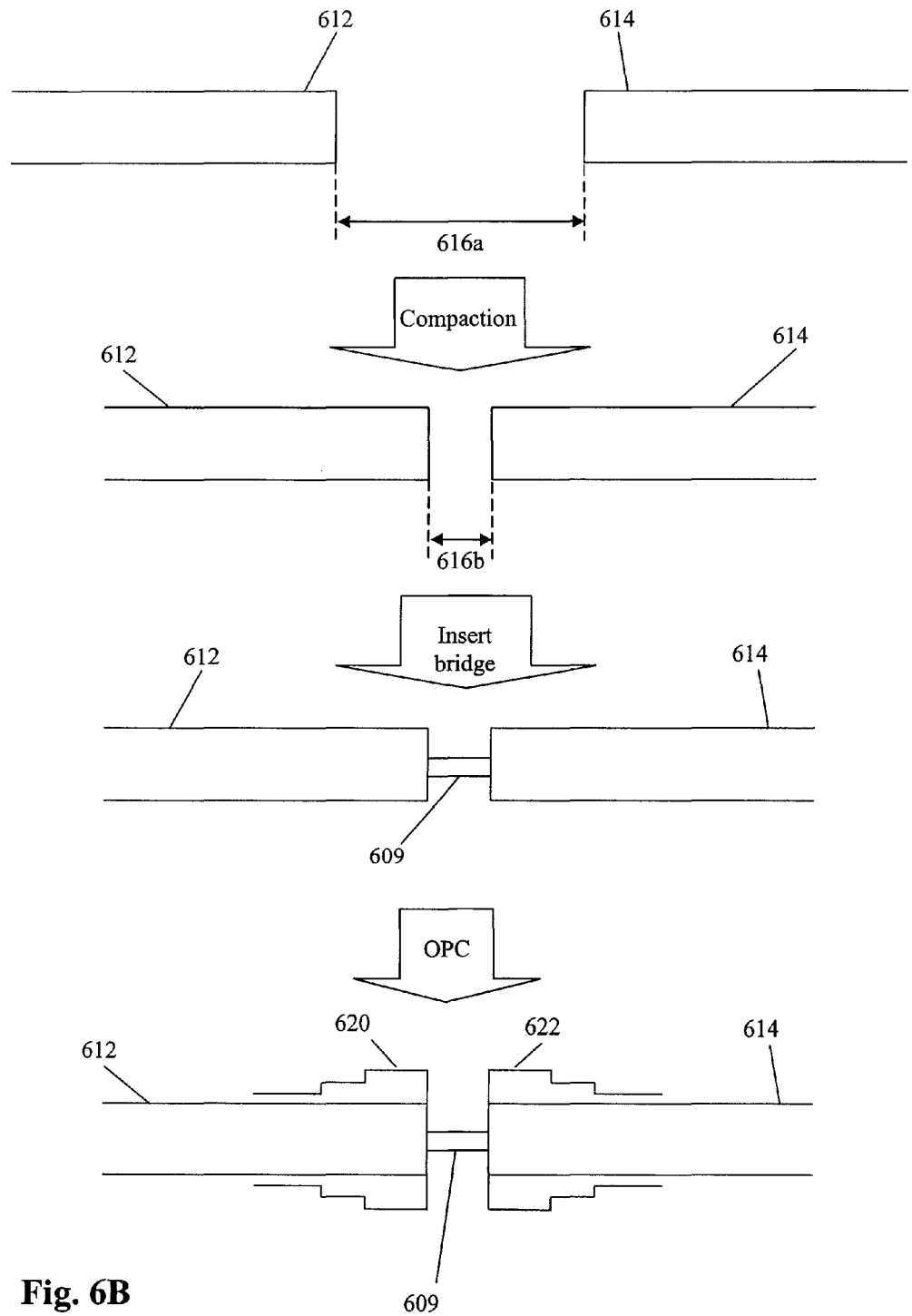
FIG. 6B illustrates controlled breaks applied to an example layout portion for compaction according to some embodiments of the invention.

This process is illustrated in the example of FIG. 6B. The example layout portion includes a first feature 612 in an end-to-end configuration relative to a second feature 614. The two features 612 and 614 are separated by a fairly large distance 616*a*. Since distance 616*a* is substantially larger than the distance required by minimum spacing rules, this layout portion becomes a good candidate for compaction.

Compaction is performed to reduce the spacing between feature 612 and 614 to a much smaller distance 616*b*. At this distance, it is not possible to use conventional RET and OPC techniques to correct line end spacing problems.

The controlled break approach of the present invention is then performed to insert a bridging feature 609 between features 612 and 614. This bridging feature will correct the line end spacing issue during the lithography process.

RET or OPC processing can then be performed to add structures to further optimize the layout. As shown in FIG. 6B, hammerhead patterns are added to the features to bias the printing of the line ends such that the lines are printed with adequate dimensions and widths.

Embodiments of the invention can also be to facilitate or optimize applications of Double Patterning Technology (DPT). For photolithographic processes, each combination of light/optics has a certain maximum spatial frequency on the wafer, where the smallest size of any feature that can be created on a wafer is severely limited by the pitch of the processing system. A pitch is a combination of the width of a feature plus the spacing between features. A photolithographic process can make a narrow line by adjusting the threshold or dose, but not a smaller pitch. As the complexity of modern IC designs increase over time, the quantity and density of shapes on an IC design also increase in corresponding fashion. However, the goal of manufacturing IC chips at ever denser and smaller feature sizes is in sharp tension with the pitch limits of existing photolithographic processing tools which are significantly limited by pitch size.

DPT refers to a manufacturing approach that breaks an IC design to be printed into two or more exposures, each of which has at least the minimum pitch. Together, these multiple exposures print a design that could not be printed in one exposure alone. This approach allows smaller mask features to be printed on wafers without requiring new manufacturing equipment and with minor changes to existing manufacturing processes. The approach also does not require restrictions on the design of the chip.

Figure 7:
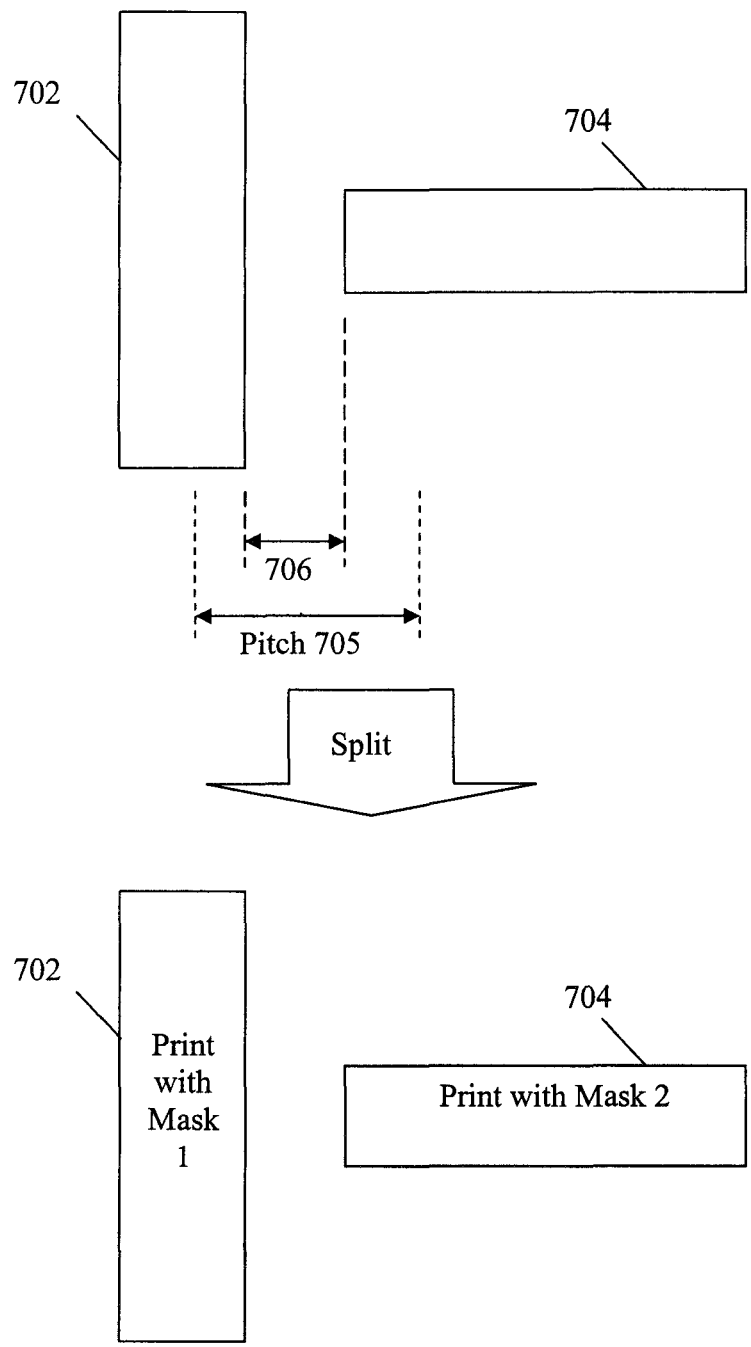
FIGS. 7 and 8 illustrates layout portions that are split to accommodate multi-mask/exposure printing.

FIG. 7 illustrates an example layout portion that could be printed using DPT. In this example, a vertical object 702 is adjacent to a horizontal object 704, where the two objects are separated by a spacing distance 706. Assume that the minimum pitch for the processing equipment being used to manufacture the IC product having this configuration of features is the pitch 705 as shown in the figure. It can be seen that the spacing distance 706 between the features 702 and 704 is smaller than the minimum pitch 705, rendering the configuration of features 702 and 704 unprintable by conventional techniques.

One solution to this problem is to split the features 702 and 704 onto different masks. For example, feature 702 could be placed onto a first mask and feature 704 placed onto a second mask. Feature 702 would be manufactured using a first distinct exposure with the first mask. Feature 704 would be manufactured using a second distinct exposure with the second mask. The combination of the first and second exposures would result in manufacture of both features 702 and 704 in the final IC product.

Splitting features onto multiple masks does require the expenditure of additional costs. These costs would include, for example, the additional time and effort required to make multiple exposures, which would reduce the throughput of the manufacturing process. Moreover, the costs to design and manufacture masks would increase as the number of masks required for manufacturing the IC product increases. Therefore, it would be advantageous to be able to manufacture designs having spacing distances between features smaller than minimum pitches while also minimizing the requirement to split a layer into multiple masks.

Figure 8:
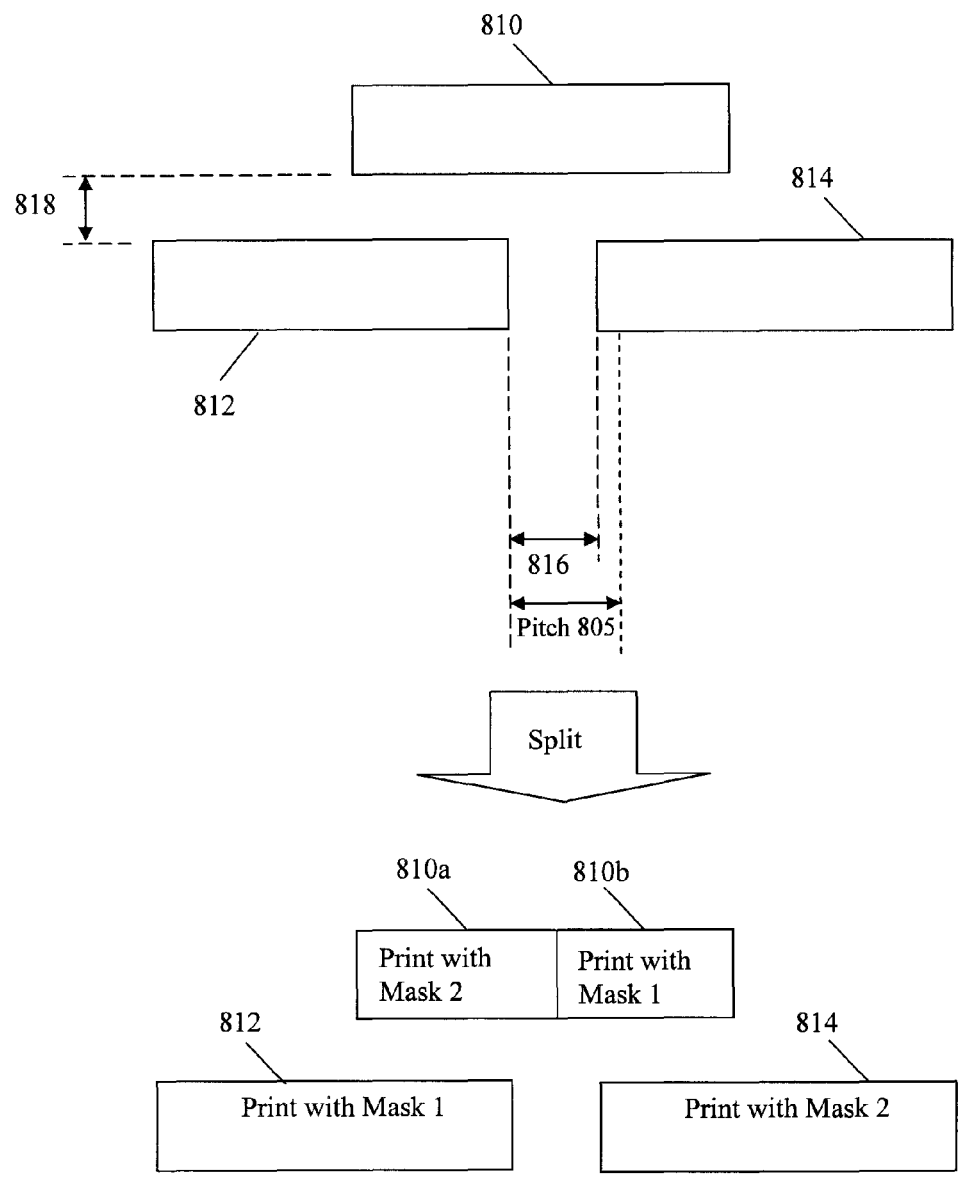

FIG. 8 illustrates another example layout portion. In this example, two features 812 and 814 are adjacent to one another in an end-to-end configuration. These two features 812 and 814 are separated by a spacing distance 816. Another object 810 is parallel to both features 812 and 814, and is separated by a spacing distance 818. Assume that the minimum pitch for the processing equipment being used to manufacture the IC product having this configuration of features is the pitch 805 as shown in the figure. It can be seen that the spacing distances 816 and 818 between the features are smaller than the minimum pitch 805, rendering the configuration of features unprintable by conventional techniques.

However, even when using DPT to print this layout using multiple masks, there are additional problems to be faced for this example. For instance, consider if feature 812 is printed using a first mask and feature 814 is printed using a second mask. The question remains as to whether feature 810 should be placed on either the first mask or the second mask. If feature 810 is placed onto the first mask, then it does not conflict with feature 814 on the second mask, but feature 810 would still be spaced too close to feature 812 which is also on the first mask. However, if feature 810 is placed on the second mask, then it does not conflict with feature 812 on the first mask, but feature 810 would still be spaced too close to feature 814 on the second mask.

The solution is to split feature 810 such that it is printed using both masks. For example, portion 810a of feature 810 may be split off to be printed with the second mask. Portion 810b of feature 810 could be split off to be printed with the first mask. This would allow portion 810b on the same mask as feature 812 to be spaced from each other with a distance greater than the minimum pitch 805. Similarly, portion 810a would be on the same mask as feature 814 and spaced apart from each other with a distance greater than the minimum pitch 805. In this way, each object to be printed on each of the masks would have sufficient spacing from other objects on the same mask to address the minimum pitch issue.

The problem with this approach is that separated portions 810a and 810b would have to be stitched together during the manufacturing process to form a unified feature 810. It is a highly complex process to split a single feature apart and then to adequately stitch those portions back together again. The dimensions and character of the resulting stitched feature is highly subject to process variations and manufacturing uncertainties. As such, it would be advantageous to be able to manufacture designs using DPT approaches while also minimizing the requirement to split individual features into multiple portions that are printed with multiple masks.

Figure 9:
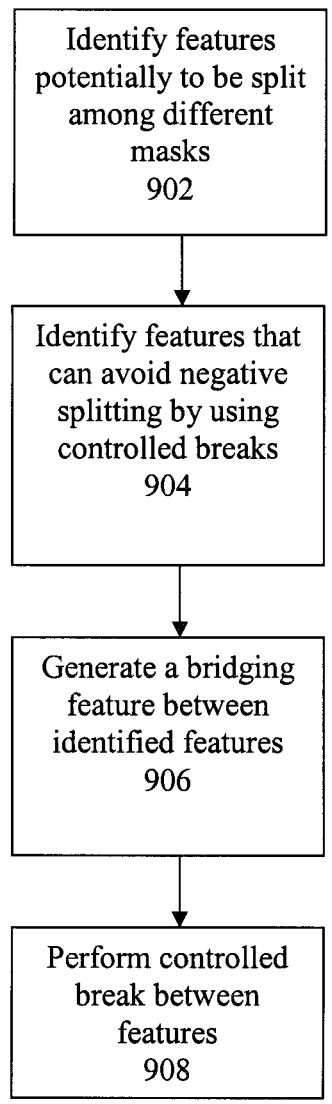
FIG. 9 shows a flowchart of a process for applying controlled break processing to facilitate or optimize multi-mask/exposure printing according to some embodiments of the invention.

FIG. 9 shows a flowchart of an embodiment of a process for using controlled breaks to facilitate and optimize multi-exposure lithography manufacturing of IC products. At 902, the process identifies the features that potentially need to be split among multiple masks. In one embodiment, this action identifies the individual features that are to be split into multiple portions between multiple masks. In an alternate embodiment, this action identifies the separate features on the same layer that are to be split among different masks. In yet another embodiment, features corresponding to both types of splitting are identified.

Next, at 904, a determination is made regarding which of the identified features corresponding to a split can be beneficially addressed using controlled breaks. For example in one embodiment, this action identifies the individual features that are to be split into multiple portions between multiple masks, for which controlled breaks may be employed to avoid such splitting into multiple portions. As another example, this action may be used to identify separate layout features for which controlled breaks can be used to entirely avoid splitting between multiple masks.

For the identified features, at 906, bridging features are added as necessary to implement the expected optimization to avoid splitting features. During the lithography process, at 908, the bridging features would cause a controlled break to be performed to print the layout objects.

Figure 10A:
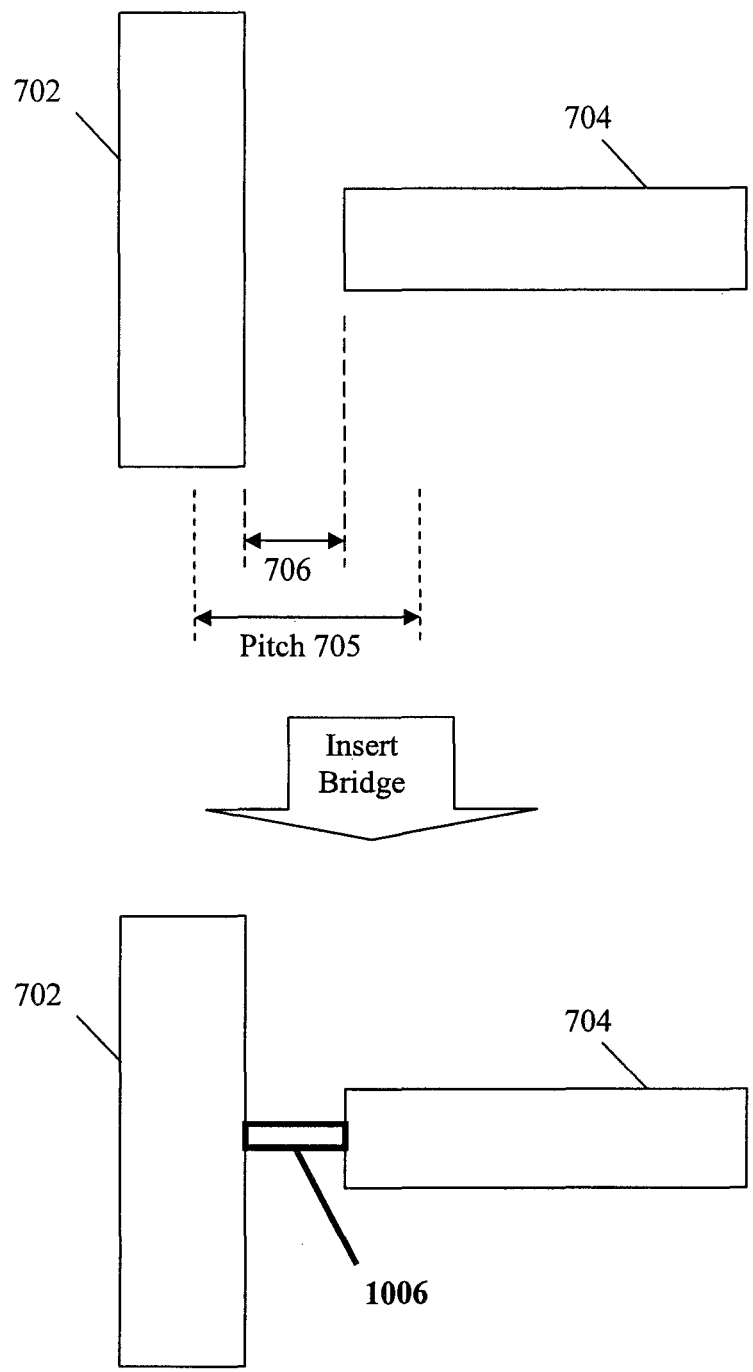

FIG. 10A illustrates this process applied to the example layout portion from FIG. 7. Recall that the example layout portion includes a vertical object 702 adjacent to a horizontal object 704, where the two objects are separated by a spacing distance 706. It was assumed that the minimum pitch for the processing equipment being used to manufacture the IC product having this configuration of features is the pitch 705 as shown in the figure. Spacing distance 706 between the features 702 and 704 is smaller than the minimum pitch 705, rendering the configuration of features 702 and 704 unprintable by conventional techniques.

According to one embodiment of the invention, this problem is addressed by inserting a bridging feature 1006 between features 702 and 704. This forms a single large layout object that is formed by the combined structures of features 702, 704, and 1006, in which the bridge portion 1006 is a SRAF notched bridge that will not be printable. The combined object will be placed on a single mask for manufacturing. During lithography processing, a controlled break is effected which allows features 702 and 704 to be printed as intended, with spacing distance 706 to exist between those two features. Since the large combined object does not contain any spacing gaps smaller than the minimum pitch, it will avoid the pitch problems inherent for the processing equipment.

Figure 10B:
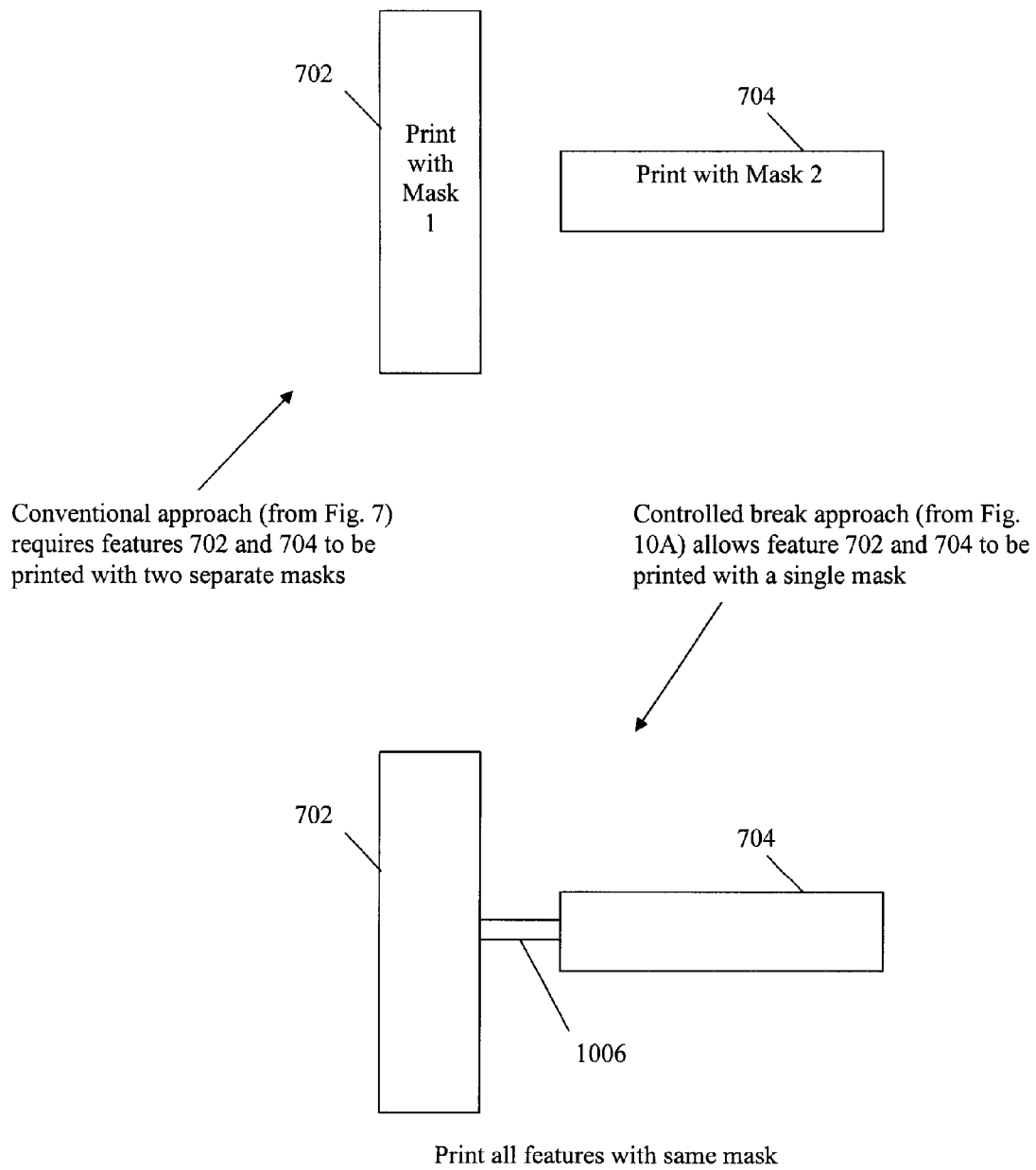

FIG. 10B shows the contrast between the conventional DPT approach and the approach of the present embodiment. With the conventional DPT approach, the layout portion must be printed using multiple masks. In particular, feature 702 is printed using a first mask and feature 704 is printed using a second mask. This approach would require the design and manufacturing of multiple masks for the same layer of design, as well as requiring additional exposures because of the multiple masks.

With the approach of the present embodiment, both features 702 and 704 can be printed using the same mask. This approach may reduce the costs associated with having to design and manufacture multiple masks. This approach may also lessen the expense, time, and reduced production associated with multiple exposures during manufacturing.

Referring to FIG. 10C, it is noted that additional layout optimizations, such as RET and OPC optimizations, may be applied to further enhance the printed qualities of the printed features. For example, as shown in this figure, hammerhead OPC structures 1008 may be applied to the end of feature 704. Structure 702 may be modified as 702b to apply some bias towards the leftwards direction to counter the biasing effect of the bridge feature 1006b.

Figure 11A:
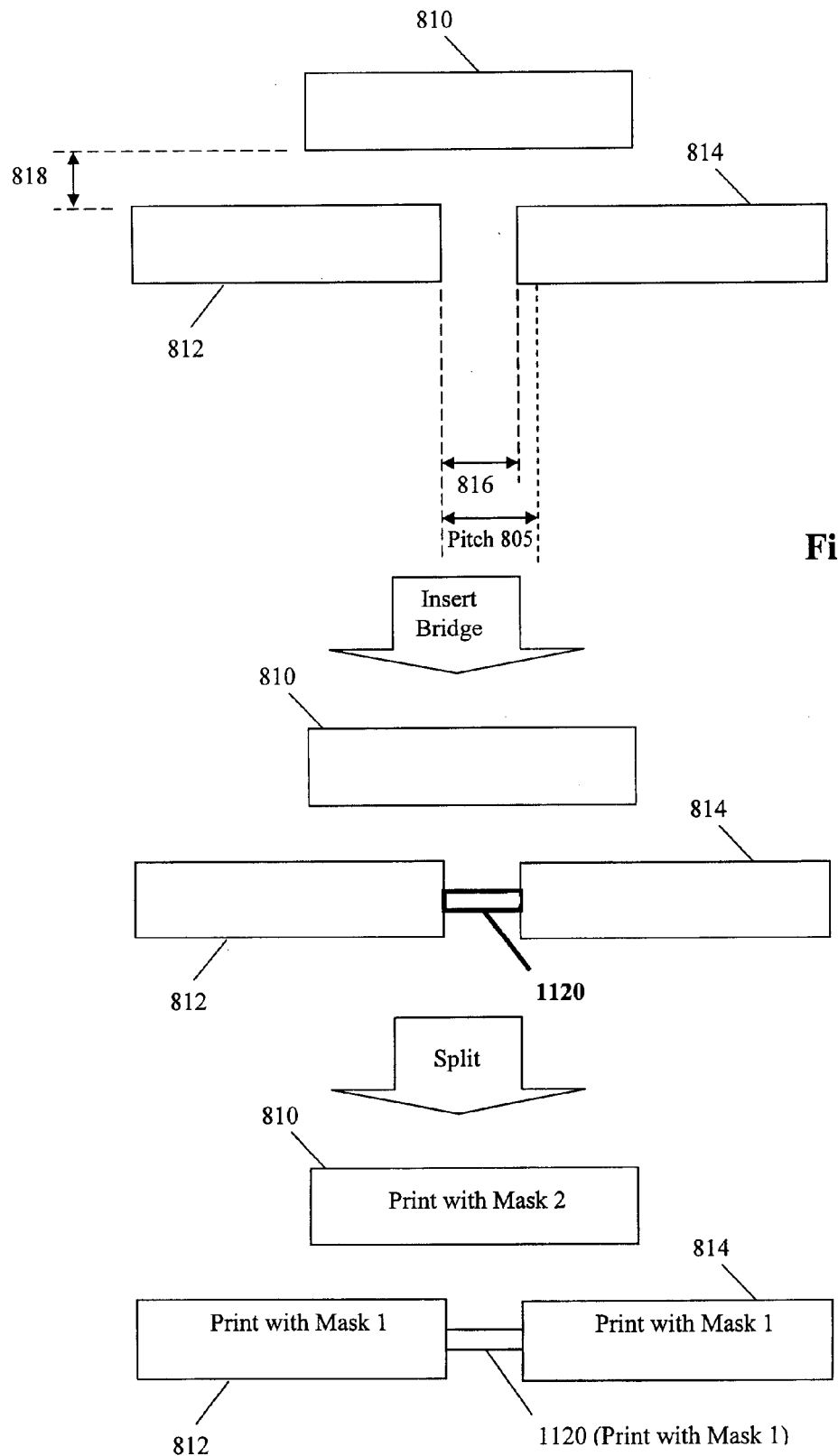

FIG. 11A illustrates this process applied to the example layout portion from FIG. 8.

Recall that in this example layout portion, features 812 and 814 are adjacent to one another in an end-to-end configuration. These two features 812 and 814 are separated by a spacing distance 816. Another object 810 is parallel to both features 812 and 814, and is separated by a spacing distance 818. It was assumed that the minimum pitch for the processing equipment being used to manufacture the IC product having this configuration of features is the pitch 805, where spacing distances 816 and 818 between the features are smaller than the minimum pitch 805, rendering the configuration of features unprintable by conventional techniques.

According to one embodiment of the invention, this problem is addressed by inserting a bridging feature 1120 between features 812 and 814. This forms a single large layout object based upon the combined structures of features 812, 814, and 1120, in which the bridge portion 1120 is a SRAF structure that will not be printed. The mask manufacturer would view this combined structure as a single line with a notched portion at the location of the bridge 1120. The combined object having features 812, 814, and 1120 would be placed on a first mask for manufacturing. Since both features 812 and 814 can be placed on the first mask, the entirety of feature 810 can be placed on a second mask for manufacturing, without having to split up feature 810 onto different masks.

During lithography processing, a controlled break is effected which allows features 812 and 814 to be printed as intended, with spacing distance 816 to exist between those two features. Since the large combined object does not contain any spacing gaps smaller than the minimum pitch, it will avoid the pitch problems inherent for the processing equipment.

Figure 11B:
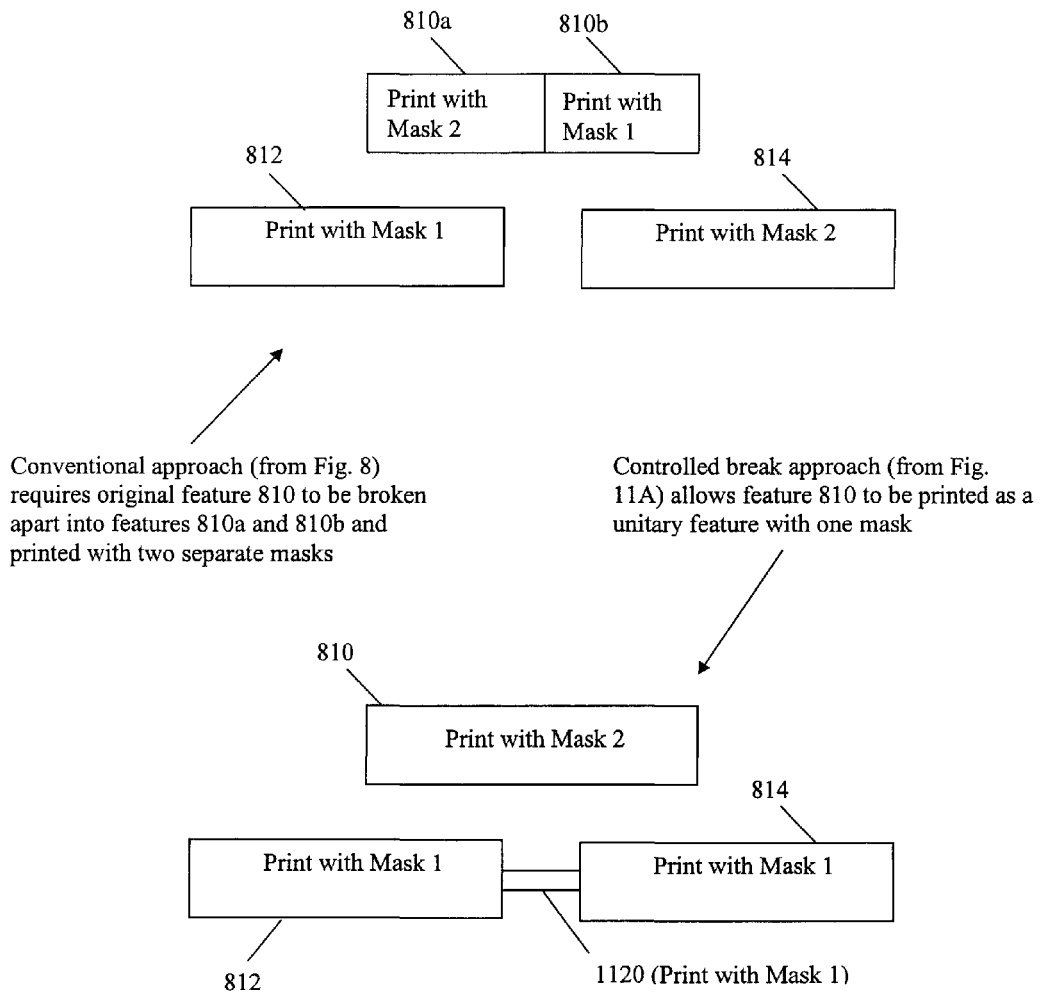

FIG. 11B shows the contrast between the conventional DPT approach and the approach of the present embodiment. With the conventional DPT approach, the layout portion 810 must be broken up into two split portions 810a and 810b. These portions 810a and 810b would be placed on different masks for printing, and then stitched together during the manufacturing process.

With the approach of the present embodiment, feature 810 can be placed on a single mask for printing. This approach completely avoids the need to split feature 810 into separated portions 810a and 810b, and would therefore also completely avoid the need to stitch these portions together during manufacturing.

Figure 12A:
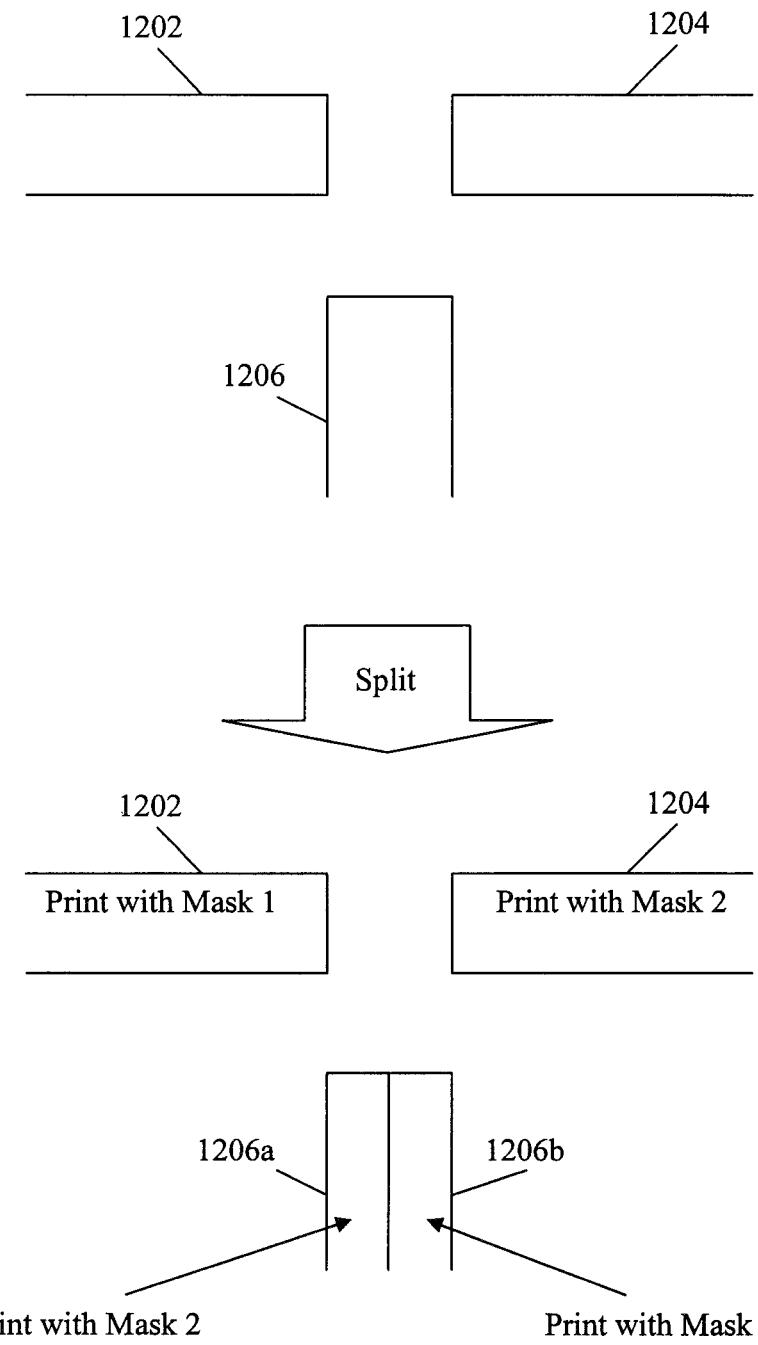

FIG. 12A illustrates another example layout portion. Here, features 1202 and 1204 arranged in an end-to-end configuration, and feature 1206 has its end pointed at the open space between features 1202 and 1204. Assume that the spacing distances between all three objects exceeds the minimum pitch for the processing equipment being used to manufacture the IC product.

With conventional DPT approaches, features 1202 and 1204 would need to be placed onto different masks. For example, feature 1202 would be placed on a first mask and feature 1204 placed on a second mask. To avoid the minimum pitch problem, feature 1206 would be split into portions 1206a and 1206b. Portion 1206a would be placed on the second mask and portion 1206b would be placed on the first mask.

Figure 12B:
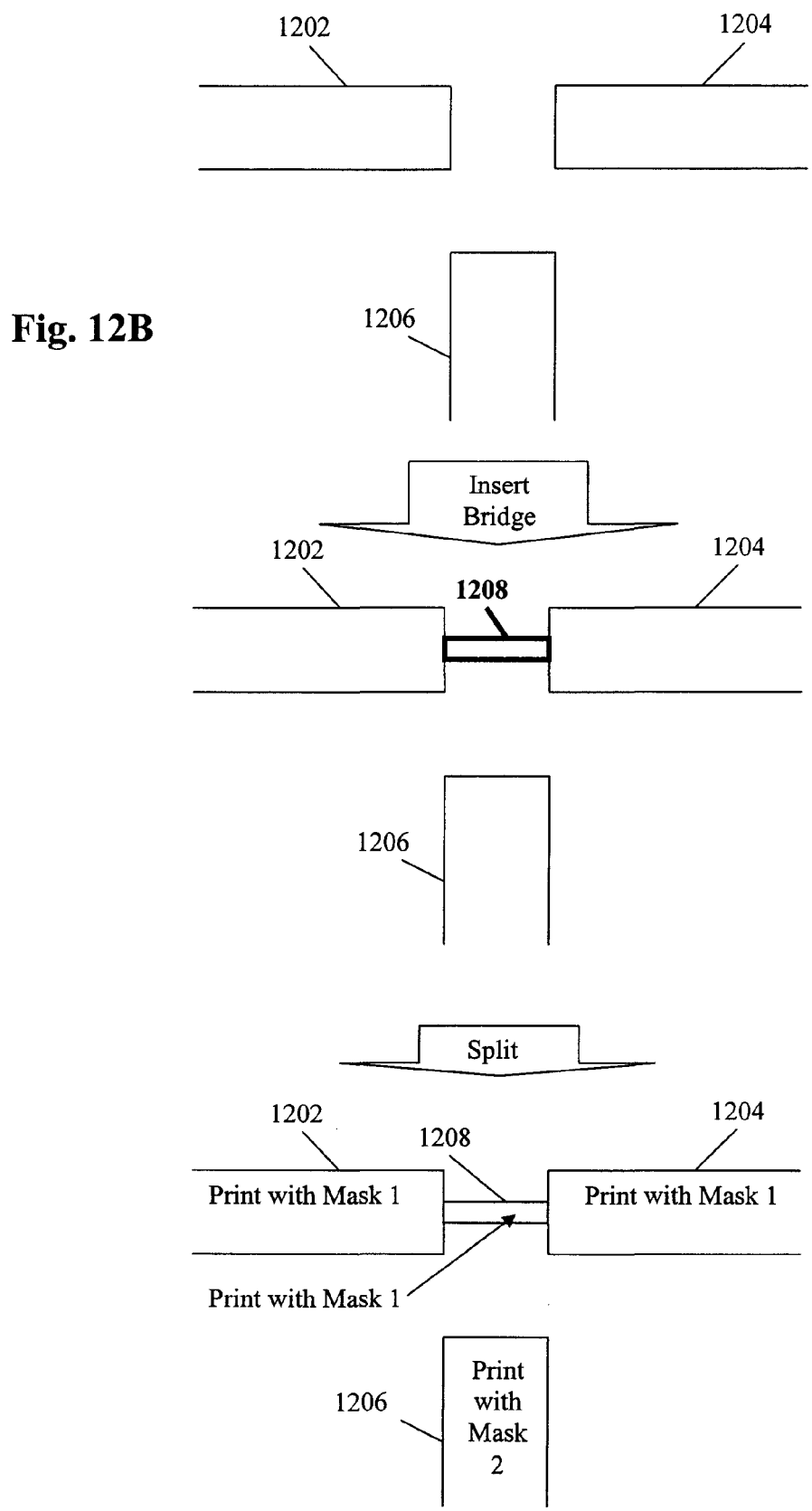

FIG. 12B shows an approach that can be taken with one embodiment of the invention to avoid having to split feature 1206 into multiple portions on multiple masks. In this approach, an SRAF bridge 1208 is placed in the opening between features 1202 and 1204. This allows the single large object formed by the combination of features 1202, 1208, and 1208 to be printed with the same mask. As such, feature 1206 can be placed in its entirety, without splitting, onto another mask.

Figure 12C:
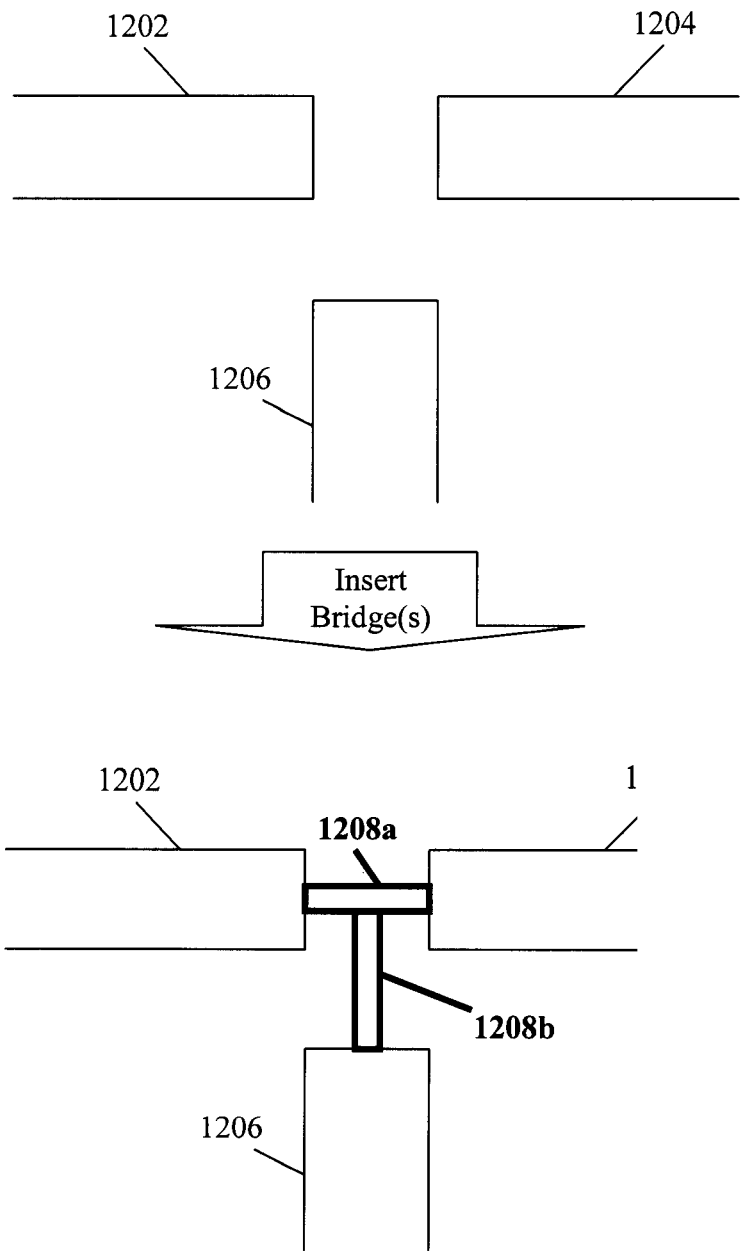

FIG. 12C shows an alternate approach that can be taken with another embodiment of the invention. In this approach, multiple SRAF bridges 1208a and 1208b are inserted in the openings between features. In particular, feature 1208a is inserted to bridge between features 1202 and 1204. Feature 1208b is inserted to bridge between feature 1206 and the other bridging feature 1208a.

The effect of these bridges is to form a single large object based upon the combined structures of features 1202, 1204, 1206 and bridges 1208a and 1208b. This single large structure can be placed in its entirety on a single mask. During the manufacturing process, controlled breaks will occur at the locations of the bridge features. This allows the entire structure to be printed without using any DPT processing.

System Architecture Overview

Figure 13:
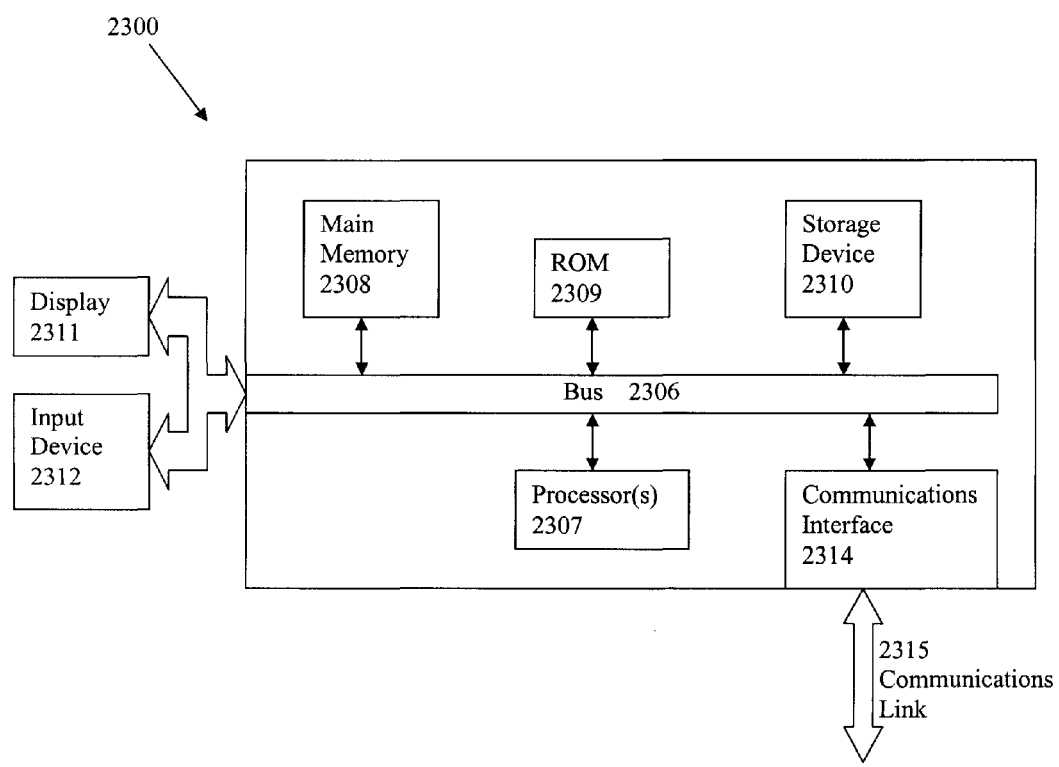
FIG. 13 illustrates an example computing architecture with which embodiments of the invention may be practiced.

FIG. 13 is a block diagram of an illustrative computing system 2300 suitable for implementing an embodiment of the present invention. Computer system 2300 includes a bus 2306 or other communication mechanism for communicating information, which interconnects subsystems and devices, such as processor 2307, system memory 2308 (e.g., RAM), static storage device 2309 (e.g., ROM), disk drive 2310 (e.g., magnetic or optical), communication interface 2314 (e.g., modem or Ethernet card), display 2311 (e.g., CRT or LCD), input device 2312 (e.g., keyboard), and cursor control.

According to one embodiment of the invention, computer system 2300 performs specific operations by processor 2307 executing one or more sequences of one or more instructions contained in system memory 2308. Such instructions may be read into system memory 2308 from another computer readable/usable medium, such as static storage device 2309 or disk drive 2310. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 2307 for execution. Such a medium may take many forms, including but not limited to, non-volatile media, volatile media, and transmission media. Non-volatile media include, for example, optical or magnetic disks, such as disk drive 2310. Volatile media include dynamic memory, such as system memory 2308.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 2300. According to other embodiments of the invention, two or more computer systems 2300 coupled by communication link 2315 (e.g., LAN, PTSN, or wireless network) may perform the sequence of instructions required to practice the invention in coordination with one another.

Computer system 2300 may transmit and receive messages, data, and instructions, including program, i.e., application code, through communication link 2315 and communication interface 2314. Received program code may be executed by processor 2307 as it is received, and/or stored in disk drive 2310, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method of optimizing electronic designs that are subject to manufacturing with multiple lithographic patterning and exposures, comprising:
    using the at least one processor to perform a process, the process comprising:
    determining a first feature within an electronic design that potentially needs to be split into multiple features to be placed among multiple lithography masks for exposure; and
    generating a bridging feature between the first feature and at least one feature of one or more features that are identified to reduce a requirement of using the multiple lithography masks to print the first feature, in which
        the bridging feature is structured so that a controlled break will occur at the bridging feature during lithographic printing, and
        the controlled break affects the first feature such that the first feature will not need to be split among the multiple masks during lithographic printing.

2. The computer implemented method of claim 1, in which the controlled break affects the one or more features to implement a single feature printed with a single mask and to avoid having a single feature split into multiple portions across the multiple masks during lithographic printing.

3. The computer implemented method of claim 1, in which the controlled break affects the one or more features to have a first feature and second feature print with the same mask to avoid the first feature printed with a first mask and the second feature printed with a second mask.

4. The computer implemented method of claim 1, the process further comprising optimizing an application of double patterning technology.

5. The computer implemented method of claim 1, in which the bridging feature comprises a sub-resolution bridge having at least one notch.

6. The computer implemented method of claim 1, further comprising:
    applying either optical proximity correction or a resolution enhancement technique to the at least two of the features.

7. The computer implemented method of claim 1, in which the bridging feature is applied to at least three features.

8. A computer program product comprising a non-transitory computer readable storage medium storing thereupon a sequence of instructions which, when executed by at least one processor of a computing system, causes the at least one processor to execute a method for optimizing electronic designs that are subject to manufacturing with multiple lithographic patterning and exposures, the method comprising:
    using the at least one processor to perform a process, the process comprising:
    determining a first feature within an electronic design that potentially needs to be split into multiple features to be placed among multiple lithography masks for exposure; and
    generating a bridging feature between the first feature and at least one feature of one or more features that are identified to reduce a requirement of using the multiple lithography masks to print the first feature, in which
        the bridging feature is structured so that a controlled break will occur at the bridging feature during lithographic printing, and the controlled break affects the first feature such that the first feature will not need to be split among the multiple masks during lithographic printing.

9. The computer program product of claim 8, in which the controlled break affects the one or more features to implement a single feature printed with a single mask and to avoid having a single feature split into multiple portions across the multiple masks during lithographic printing.

10. The computer program product of claim 8, in which the controlled break affects the one or more features to have a first feature and second feature print with the same mask to avoid the first feature printed with a first mask and the second feature printed with a second mask.

11. The computer program product of claim 8, the process further comprising optimizing an application of double patterning technology.

12. The computer program product of claim 8, in which the bridging feature comprises a sub-resolution bridge having at least one notch.

13. The computer program product of claim 8, the process further comprising:
applying either optical proximity correction or a resolution enhancement technique to the at least two of the features.

14. The computer program product of claim 8, in which the bridging feature is applied to at least three features.

15. A system for optimizing electronic designs that are subject to manufacturing with multiple lithographic patterning and exposures, comprising:
at least one processor that is to:
determine a first feature within an electronic design that potentially needs to be split into multiple features to be placed among multiple lithography masks for exposure; and
generate a bridging feature between the first feature and at least one feature of one or more features that are identified to reduce a requirement of using the multiple lithography masks to print the first feature, in which
the bridging feature is structured so that a controlled break will occur at the bridging feature during lithographic printing, and
the controlled break affects the first feature such that the first feature will not need to be split among the multiple masks during lithographic printing.

16. The system of claim 15, in which the controlled break affects the one or more features to implement a single feature printed with a single mask and to avoid having a single feature split into multiple portions across the multiple masks during lithographic printing.

17. The system of claim 15, in which the controlled break affects the one or more features to have a first feature and second feature print with the same mask to avoid the first feature printed with a first mask and the second feature printed with a second mask.

18. The system of claim 15, in which the at least one processor is further to optimize an application of double patterning technology.

19. The system of claim 15, in which the bridging feature comprises a sub-resolution bridge having at least one notch.

20. The system of claim 15, the at least one processor is further to:
apply either optical proximity correction or a resolution enhancement technique to the at least two of the features.

* * * * *